United States Patent [19]
Nelson

[11] 4,451,839
[45] May 29, 1984

[54] BILATERAL ZENER TRIM
[75] Inventor: Carl T. Nelson, Sunnyvale, Calif.
[73] Assignee: National Semiconductor Corporation, Santa Clara, Calif.
[21] Appl. No.: 486,153
[22] Filed: Apr. 19, 1983

Related U.S. Application Data
[63] Continuation of Ser. No. 186,797, Sep. 12, 1980, abandoned.

[51] Int. Cl.³ .............................................. H01L 29/90
[52] U.S. Cl. ........................................ 357/13; 357/51; 357/52; 357/55; 357/86
[58] Field of Search .................... 357/13, 51, 52, 55, 357/86

[56] References Cited
U.S. PATENT DOCUMENTS
3,932,879  1/1976  Pace ..................................... 357/13

Primary Examiner—Edward J. Wojciechowicz
Attorney, Agent, or Firm—Gail W. Woodward; Paul J. Winters; Michael J. Pollock

[57] ABSTRACT

In an integrated circuit, back to back zener diodes are connected between circuit pads and each zener diode shunts a resistor in a series string. When a suitable pulse is applied to the pair, the back biased diode will be selectively shorted. Thus, the pulse polarity will determine which diode will short and which resistor will be bypassed. In this manner a pair of pads can be used to selectively short out either one or both of a pair of diodes and a trimming section can be created using only half of the pads required in the case where each zener is contacted separately. The invention is directed to a structure in which the forward biased zener diode is protected so that only the reverse biased diode shorts out when the pulse is applied.

7 Claims, 3 Drawing Figures

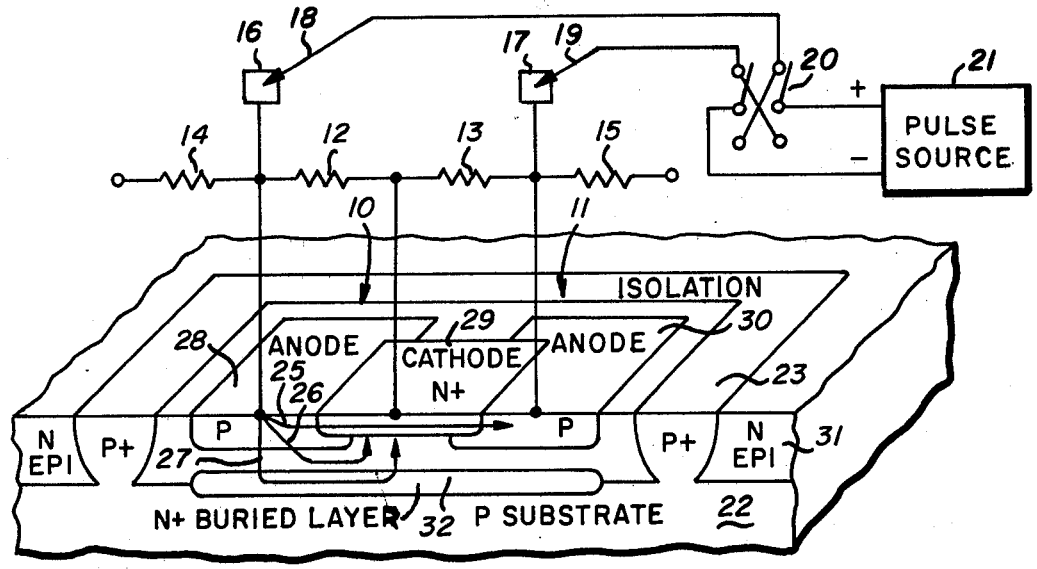
Fig_1 (PRIOR ART)
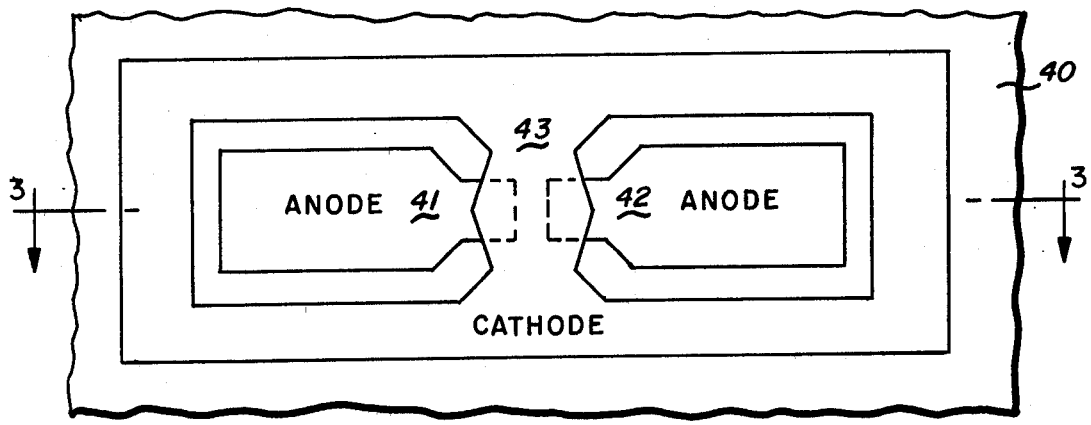
Fig_2
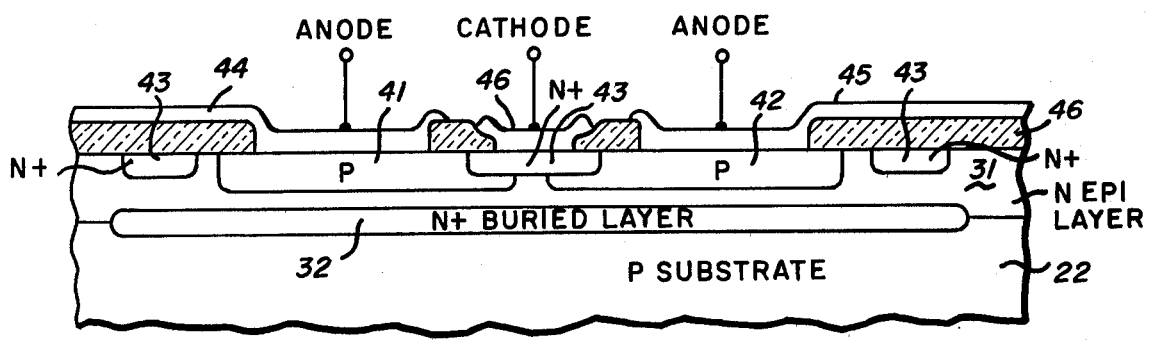
Fig_3

BILATERAL ZENER TRIM

This is a continuation of application Ser. No. 186,797 filed on Sept. 12, 1980, now abandoned.

BACKGROUND OF THE INVENTION

In copending application Ser. No. 18,815, filed Mar. 18, 1978, now U.S. Pat. No. 4,225,878 by Robert C. Dobkin, an integrated circuit (IC) trim structure is disclosed. This patent application teaches the use of back to back zener diodes in conjunction with a resistor string for trimming an IC in wafer form. The resistor string is connected in series with an IC element that is to be trimmed to cause the circuit to conform with a predetermined specification. Each pair of diodes is coupled to a chip pad pair and a pulse is applied by probes connected to the pads. The pulse is selected so that the zener diode that is reverse biased shorts out thereby shorting the associated resistor. The forward biased diode is unharmed so that its shunt resistor is still effective. The arrangement allows the creation of a so called "zener zap" trim structure that requires only half of the number of chip pads that the prior art used. The zener diodes can be manufactured using the conventional elements ordinarily found in IC structures.

I have discovered that, for the standard common cathode structure, the pulse that is applied must often be very precisely controlled to avoid damaging the forward biased junction. It would be desirable to have a broader pulse range so that precision pulsing is not required.

SUMMARY OF THE INVENTION

It is an object of the invention to create a zener diode pair structure in which the forward biased diode has an additional low impedance current path which shunts a portion of the forward biased current away from the reverse current flow path.

It is a still further object of the invention to provide a zener diode pair in which a common cathode is made to form a spaced apart region surrounding each anode so that when forward biased the anode current is shunted away from the reverse current path.

These and other objects are achieved by fabricating a back-to-back zener diode pair in a conventional monolithic IC in the following manner. A pair of diode anodes are created using conventional transistor base diffusions. A common cathode is created using a conventional emitter diffusion that is configured to overlap the pair of anodes. The cathode diffusion is configured to closely surround each anode but to overlap only in the desired zener region. When reverse biased, such a structure will display the conventional zener diode action and can be caused to short out by the application of a brief reverse bias current pulse of suitable amplitude. However, when such a diode is forward biased the anode will inject large currents into the lightly doped region between the anode and the cathode ring. This action causes conductivity modulation of the intervening semiconductor material which makes the forward biased diode highly conductive. The ring shunts a substantial portion of the current around the region of diode overlap so that there is much less chance of damaging the forward biased diode. Thus, the bilateral structure can be pulsed so as to selectively short out only the reverse biased element with much reduced danger of damaging the forward biased one.

BRIEF DISCRIPTION OF THE DRAWING

FIG. 1 shows the prior art common cathode structure for a zener diode pair;

FIG. 2 is a top view of the structure of the invention; and

FIG. 3 is a sectional view of the structure of FIG. 2 taken at the line 3—3.

DESCRIPTION OF THE PRIOR ART

In the earliest zener zapping prior art (not shown) a series of trimming resistors is incorporated into the IC. Each resistor has a shunt connected zener diode and each diode is coupled to a pair of IC pads. Thus there is one pad per diode (plus one). In trimming a diode is selected and a pulse of reverse current passed thereby causing it to permanently short the associated resistor. By this means any of the diode shunted resistors can be selectively shorted and the circuit thereby trimmed after manufacture.

FIG. 1 shows a recent improvement in the conventional prior art zener zap arrangement using common cathode zener diodes 10 and 11. These diodes are constructed in a conventional monolithic IC structure. P type substrate 22 has a N type epitaxial layer 31 thereon and a P+ diffusion ring 23 completely penetrates layer 31 so as to isolate a tub of the N type material. The tub ordinarily includes a conventional N+ buried layer 32 which acts to reduce parasitic resistance.

In FIG. 1, the oxide and metal layers have been omitted for clarity and the metallization contacts are shown schematically. It is to be understood that the drawing is not to scale but is exaggerated to better illustrate the structure.

Diodes 10 and 11 include anodes 28 and 30 which are conventional IC NPN transistor base diffusions. The common cathode 29 is an emitter diffusion which overlaps the two anodes to create the zener diode pair. These diodes respectively shunt resistors 12 and 13 which are part of a resistor chain that may include resistors 14 and 15 as well. These resistors can be conventional diffused or ion implanted devices or they can be made from resistance material on top of the IC oxide. Each pair of diodes is coupled to a pad pair such as 16 and 17 which can be contacted by probes 18 and 19 which can be coupled through switch 20 to pulse source 21. With switch 20 in the position shown, diode 10 will be forward biased while diode 11 will be reverse biased. The pulse magnitude from source 21 can be selected so as to selectively short diode 11 so that it shorts out resistor 13. If switch 20 is actuated downward, the polarity is reversed and diode 10 will short out resistor 12. It has been found that using conventional emitter-base diodes as commonly found in monolithic IC structures, a 0.5 to 1.5 ampere current pulse applied for 10 milliseconds will cause the zener to become permanently shorted. Such a pulse will not ordinarily harm a diffused resistor connected across the diodes. Thus, a very effective resistor trimming means is available. The only requirement is that the operating IC must not impress sufficient voltage drop across the resistors to produce forward or reverse diode conduction in unzapped zener diodes. In many applications this can be achieved and zener zapping has become fairly common. The back to back diode configuration substantially reduces the number of pads required and therefore is of considerable interest.

For the arrangement shown in FIG. 1, where diode 10 is forward biased, it can be seen that there are three current paths 25, 26, and 27 as indicated by the arrows. Path 25 extends directly from the anode 28, through cathode 29, and to anode 30. Path 26 involves current injected from anode 28 into epitaxial layer 31 and collected by cathode 29 after traveling through the epitaxial material. Path 27 involves current injected straight down to buried layer 32 then back up through epitaxial layer 30 to cathode 29. The only difference between paths 26 and 27 is that buried layer 32 effectively provides a low resistance portion in path 27.

I have determined that in a typical structure, the major portion of the current will flow in path 25. Because of this, the forward biased diode will sometimes be damaged by the current levels required to ensure complete shorting of the reverse junction. It is important that in the zapping operation that only one diode is shorted by a pulsing operation.

DESCRIPTION OF THE INVENTION

FIG. 2 shows an IC topography for making a zener diode pair in accordance with the preferred embodiment of the invention. The drawing is of a fragment of IC surface 40 which involves the N type epitaxial material. While not shown a P+ type isolation diffusion will act to isolate the diode structure. In FIG. 2, the oxide and metal layers have been omitted for clarity.

Anodes 41 and 42 are shaped as shown and are spaced apart to achieve individual elements. These anodes are made from conventional NPN transistor base diffusions. The common cathode 43 is a conventional NPN transistor emitter N+ diffusion which overlaps the anodes. The cathode also completely surrounds each anode and is spaced apart therefrom by the minimum separation that the fabrication process will reliably afford, and still provide a breakdown voltage higher than that experienced by the reverse biased junction during zapping. Thus, cathode 43 will only touch anodes 41 and 42 at the points of desired overlap, but will be spaced away around the remainder of each anode periphery. As a design preference, the anodes are made long and narrow so as to have as large a periphery to area ratio as is feasible consistent with the surface area available on the IC chip.

FIG. 3 is a cross section of the structure of FIG. 2 taken at lines 3—3. However in FIG. 3, the IC oxide and metal layers are also portrayed. The P substrate 22, epitaxial layer 31, and buried layer 32 are conventional. The anodes 41 and 42 are contacted by metal layers 44 and 45 which represent portions of IC pads suitable for probing. Pads 44 and 45 are ordinarily aluminum metallization that makes contact via holes etched in oxide layer 46 normally established in planar IC manufacturing. Common cathode 43 is contacted by metal 46 which serves as a connection to the associate trimming resistors (not shown in FIG. 3).

When either of the two diodes thus formed are forward biased, there will be substantial peripheral injection. This current will be efficiently collected by adjacent cathode 43. Since minority carriers are injected into the epitaxial material, it will be conductivity modulated to become very conductive even though it is relatively lightly doped N type material. Accordingly, the diode structure of FIGS. 2 and 3 will have a relatively high forward conductivity and will be able to support a large current without producing damage in the overlap region.

It will be noted in FIG. 2 that in the anode cathode overlap region the cathode has a reentrant structure. The point formed by the cathode is centered on the anode and will act to initiate the zener breakdown. This shape, while not critical to the invention, will assist in localizing the zener breakdown and will make it more repeatable.

The invention has been described and a preferred embodiment detailed. When a person skilled in the art reads the foregoing, alternatives and equivalents, within the spirit and intent of the invention, will occur to him. For example, all of the semiconductor conductivity types can be complemented and the related polarities reversed. Furthermore the anode periphery to area ratio could be increased further by other shapes such as star or sinuous forms. Additionally, while a single isolated IC tub is shown to contain both diodes, each diode could be in its own isolated tub and interconnected with a second diode, in another isolated tub, by means of metallization. Accordingly, it is intended that the scope of the be limited only by the following claims.

I claim:

1. A back to back diode structure for use in the trimming of a monolithic semiconductor integrated circuit in which one or more of a plurality of trimming resistors may be shorted out by passing a relatively large current through a selected parallel connected diode, said back to back diodes being contactable in pairs with the selection of which one of said pair will be shorted out being determined by the polarity of said relatively large current wherein the reverse biased one of said pair will be damaged and thereby shorted and wherein the forward biased one of said pair will pass said relatively large current without damage, said structure comprising:

a semiconductor body of one conductivity type;
   first and second spaced apart regions of opposite conductivity type arrayed in said body,
   a third region of said one conductivity type located to overlap said first and second regions in selected portions thereof, thereby to create said back to back diode structure in said selected portions;
   an extension of said third region surrounding said first and second regions and spaced therefrom except in said selected portions whereby said diodes have enhanced conductivity around their perimeters when forward biased so as to minimize damage thereto in passing said relatively large current; and
   means for making electrical connection to said first, second and third regions.

2. The structure of claim 1 wherein said first and third regions are constructed to have a narrow elongated shape to obtain a large perimeter to area ratio.

3. The structure of claim 1 wherein said third region is shaped to include a reentrant extension in said selected portions of said first and second regions, said extension being located toward the central portions of said first and second regions whereby said zener diode breakdown is localized.

4. The structure of claim 1 wherein said first and second regions are constructed using transistor base region material of the devices employed in said integrated circuit.

5. The structure of claim 4 wherein said third region is constructed using transistor emitter region material of the devices employed in said integrated circuit.

6. The structure of claim 5 in which said integrated circuit is constructed in a substrate of said opposite conductivity type having a surface epitaxial layer of said one conductivity type and surrounded by an isolation region of said opposite conductivity type, thereby to isolate said first, second and third regions from the remainder of said body.

7. The structure of claim 6 further comprising a high conductivity buried layer of said one conductivity type underlying said structure.

* * * * *